United States Patent
Hamatani (10) Patent No.: US 8,027,181 B2
(45) Date of Patent: Sep. 27, 2011

(54) LOAD DRIVE DEVICE AND VEHICLE EQUIPPED WITH THE SAME

(75) Inventor: Takashi Hamatani, Nishikamo-gun (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 461 days.

(21) Appl. No.: 12/373,149

(22) PCT Filed: Jul. 5, 2007

(86) PCT No.: PCT/JP2007/063873
§ 371 (c)(1),
(2), (4) Date: Jan. 9, 2009

(87) PCT Pub. No.: WO2008/007723
PCT Pub. Date: Jan. 17, 2008

(65) Prior Publication Data
US 2009/0279337 A1    Nov. 12, 2009

(30) Foreign Application Priority Data

Jul. 10, 2006   (JP) .................................. 2006-189414

(51) Int. Cl.
*H02M 3/24* (2006.01)
*H02H 7/122* (2006.01)
(52) U.S. Cl. .................... 363/98; 363/56.02; 363/132
(58) Field of Classification Search .............. 363/17, 363/56.01–58, 98, 132
See application file for complete search history.

(56) References Cited

U.S. PATENT DOCUMENTS

| | | | | |
|---|---|---|---|---|
| 6,384,552 B2 * | 5/2002 | Shimane et al. | ............ | 318/139 |
| 7,084,590 B2 * | 8/2006 | Miyamoto et al. | ......... | 318/400.3 |
| 7,656,690 B2 * | 2/2010 | Yamada et al. | ............ | 363/71 |
| 2002/0070710 A1 | 6/2002 | Yagi et al. | | |
| 2009/0021198 A1 * | 1/2009 | Okamura et al. | ......... | 318/400.3 |
| 2009/0160380 A1 * | 6/2009 | Yamada et al. | ......... | 318/400.15 |

FOREIGN PATENT DOCUMENTS

| | | |
|---|---|---|
| JP | 2001-169407 A | 6/2001 |
| JP | 2002-125326 A | 4/2002 |
| JP | 2004-166341 A | 6/2004 |
| JP | 2004-179113 A | 6/2004 |
| JP | 2005-45927 A | 2/2005 |
| JP | 2005-198406 A | 7/2005 |
| JP | 2005-312160 A | 11/2005 |
| JP | 2005-348510 A | 12/2005 |
| JP | 2005-354763 A | 12/2005 |
| JP | 2006-6073 A | 1/2006 |
| JP | 2006-67692 A | 3/2006 |

\* cited by examiner

*Primary Examiner* — Jessica Han
(74) *Attorney, Agent, or Firm* — Kenyon & Kenyon LLP (57) ABSTRACT

A surge voltage generated by the switching operation of an IGBT element and voltage variation generated in an equivalent series resistance of a capacitor are superimposed on an input voltage of an inverter. The equivalent series resistance has a temperature dependence that a resistance value increases with a decrease in a capacitor temperature. The IGBT element has a temperature dependence that an element withstand voltage decreases with a decrease in an inverter temperature. When capacitor temperature is lower than a predetermined threshold value, a control device reduces an upper limit value of the input voltage by an amount corresponding to the voltage variation from its upper limit value at a high temperature, and controls a target voltage of a boost converter such that an output voltage does not exceed the upper limit value. Consequently, the allowable range of the surge voltage can be ensured.

11 Claims, 9 Drawing Sheets

LOAD DRIVE DEVICE AND VEHICLE EQUIPPED WITH THE SAME

This is a 371 national phase application of PCT/JP2007/063873 filed 05 Jul. 2007, claiming priority to Japanese Patent Application No. 2006-189414 filed 10 Jul. 2006, the contents of which are incorporated herein by reference.

TECHNICAL FIELD

The present invention relates to a load drive device and a vehicle equipped with the load drive device, and more particularly to a load drive device capable of reducing the switching loss of a drive circuit and a vehicle equipped with the load drive device.

BACKGROUND ART

Vehicles such as electric vehicles (EV) and hybrid vehicles (HV) generally obtain the driving force from electric energy by using an inverter to convert the direct-current (DC) power supplied from a high voltage battery into a three-phase alternating-current (AC) power, causing a three-phase AC motor to be rotated. During the deceleration of the vehicle, the regenerative energy obtained by regeneration of the three-phase AC motor is stored in the battery, causing the vehicle to run without wasting the energy.

In the above-described hybrid vehicle or electric vehicle, the inverter is provided with six switching elements (for example, IGBT (Isolated Gate Bipolar Transistor)) having three arms bridge-connected, and the AC power for driving the three-phase AC motor is obtained from the DC power input by the switching operation of each IGBT.

At the time of the switching operation of the IGBT, a surge voltage is generated when the IGBT is switched from on to off. This surge voltage is superimposed on the input voltage of the inverter and applied between the collector and the emitter of the IGBT in the off-state. Accordingly, in order to prevent breakdown of the IGBT, the sum of the input voltage of the inverter and the surge voltage should be limited to a value of not more than the element withstand voltage of the IGBT. In order to avoid that the sum exceeds the limitation, the input resistance is inserted in series into the gate of the IGBT, and thus, the rising and falling waveforms of the signal voltage applied to the gate are caused to be gradual by this input resistance and the parasitic capacitance between the gate and the emitter of the IGBT, with the result that the switching speed is decelerated.

However, reduction in the switching speed leads to not only a decrease in the surge voltage but also an increase in the switching loss, which produces a problem of deterioration in fuel efficiency of the vehicle. Specifically, the element withstand voltage of the IGBT has a temperature dependence that it decreases with a decrease in the element temperature. Thus, in the low temperature environment, the allowable range of the surge voltage is strictly limited and the switching loss is difficult to be suppressed.

Accordingly, Japanese Patent Laying-Open No. 2001-169407 discloses a control device for an electric vehicle provided with input resistance setting means for setting a resistance value of the input resistance of a plurality of power elements in the inverter in accordance with the driving state of the vehicle.

According to the disclosure, the input resistance setting means sets a resistance value depending on any of the battery temperature, the temperature of the power element and the power consumption of the power element. Specifically, in the region where the temperature of the power element is relatively high, as the allowable surge withstand voltage of the power element is high, the decreased input resistance value causes an increase in the switching speed, and the surge voltage is permitted to be generated to the level of the generated surge voltage limit, which allows a decrease in the switching loss. On the other hand, in the relatively low temperature region, as the allowable surge withstand voltage is low, the increased input resistance value causes the generated surge voltage to be lowered below the allowable surge withstand voltage, which allows the power element to be operated with stability.

According to the control device for the electric vehicle disclosed in Japanese Patent Laying-Open No. 2001-169407 described above, however, in the region where the power element is relatively low in temperature, while the increased input resistance value of the power element causes suppression of the surge voltage generation and allows prevention of breakdown of the power element, there is still a problem that the decrease in the switching speed results in an increase in the switching loss.

It is contemplated that the hybrid vehicle or the electric vehicle is configured such that the DC voltage from the DC power supply is boosted by the boost converter to supply the boosted DC voltage to the inverter (for example, see Japanese Patent Laying-Open Nos. 2005-198406, 2005-354763 and 2004-166341).

In such a configuration, a capacitor for smoothing the DC voltage from the boost converter is provided between the output side of the boost converter and the input side of the inverter. As the smoothing capacitor, an electrolytic capacitor, a film capacitor and the like are applied, among which an aluminum electrolytic capacitor is widely used because it allows a decrease in size and an increase in capacity.

However, in the case of the aluminum electrolytic capacitor, the real part of the impedance, that is, a so-called equivalent series resistance (ESR) has temperature characteristics that it increases with a decrease in temperature. Accordingly, in the case where the aluminum electrolytic capacitor is provided on the input side of the inverter, in the low temperature region, the voltage generated in the ESR during charging and discharging of the capacitor is increased and the increased voltage is to be superimposed on the input voltage of the inverter as voltage variation. Consequently, in the low temperature region, in order to implement both of the safe operation of the IGBT and the decrease in the switching loss, it is necessary to further consider the voltage variation due to the capacitor in addition to the surge voltage described above.

Thus, the present invention is directed to solve the above-described problems and an object of the present invention is to provide a load drive device that is capable of reliably reducing the switching loss of the drive circuit.

Another object of the present invention is to provide a vehicle equipped with a load drive device that is capable of reliably reducing the switching loss of the drive circuit.

DISCLOSURE OF THE INVENTION

According to the present invention, a load drive device includes a DC power supply configured to allow an output voltage to be variably controlled; a drive circuit converting a DC voltage from the DC power supply into an AC voltage by a switching operation of a switching element to drive-control an electric load; a capacity element provided between the DC power supply and the drive circuit and smoothing the output voltage of the DC power supply for inputting to the drive circuit; and a control device controlling the DC power supply.

The capacity element has a temperature dependence that a resistance value of an equivalent series resistance increases with a decrease in temperature of the capacity element. In response to a request from the electric load, the control device sets the output voltage of the DC voltage to a value of less than an upper limit value of an input voltage of the drive circuit set depending on the temperature of the capacity element.

According to the load drive device described above, when the upper limit value of the input voltage of the drive circuit is set depending on the temperature of the capacity element, the allowable range of the surge voltage superimposed on the input voltage can be ensured irrespective of the temperature of the capacity element. Consequently, the switching loss of the drive circuit can be reliably reduced.

Preferably, the control device sets the upper limit value of the input voltage to a lower value depending on the decrease in the temperature of the capacity element.

The load drive device described above can prevent the allowable range of the surge voltage from being narrowed due to the increase in the voltage variation when the capacity element is low in temperature.

Preferably, the load drive device further includes a first temperature sensor detecting the temperature of the capacity element. The control device includes voltage variation estimation means for estimating voltage variation corresponding to a detection value of the temperature of the capacity element by previously setting a relationship between the voltage variation generated in the equivalent series resistance and the temperature of the capacity element and referring to the set relationship; first setting means for setting a first upper limit value based on an element withstand voltage of the switching element and a surge voltage superimposed on the input voltage when the detection value of the temperature of the capacity element is not less than a predetermined threshold value; and second setting means for setting a second upper limit value by decreasing the first upper limit value by a voltage corresponding to the voltage variation estimated by the voltage variation estimation means when the detection value of the temperature of the capacity element is lower than the predetermined threshold value.

According to the load drive device described above, when the temperature of the capacity element is low, the upper limit value of the input voltage of the drive circuit is decreased by the amount corresponding to the voltage variation from the upper limit value at the time when the temperature of the capacity element is high. Consequently, the allowable range of the surge voltage can be prevented from being narrowed.

According to another aspect of the present invention, a load drive device includes a DC power supply configured to allow an output voltage to be variably controlled; a drive circuit converting a DC voltage from the DC power supply into an AC voltage by a switching operation of a switching element to drive-control an electric load; a capacity element provided between the DC power supply and the drive circuit and smoothing the output voltage of the DC power supply for inputting to the drive circuit; and a control device controlling the DC power supply. The switching element has a temperature dependence that an element withstand voltage decreases with a decrease in temperature of the switching element. In response to a request from the electric load, the control device sets the output voltage of the DC voltage to a value of less than an upper limit value of an input voltage of the drive circuit set depending on the temperature of the switching element.

According to the load drive device described above, when the upper limit value of the input voltage of the drive circuit is set depending on the temperature of the switching element, the allowable range of the surge voltage superimposed on the input voltage can be ensured irrespective of the temperature of the switching element. Consequently, the switching loss of the drive circuit can be reliably reduced.

Preferably, the control device sets the upper limit value of the input voltage to a lower value depending on the decrease in the temperature of the switching element.

The load drive device described above can prevent the allowable range of the surge voltage from being narrowed due to the decrease in the element withstand voltage when the temperature of the switching element is low.

Preferably, the load drive device further includes a first temperature sensor detecting the temperature of the capacity element and a second temperature sensor detecting the temperature of the switching element. The capacity element has a temperature dependence that a resistance value of an equivalent series resistance increases with a decrease in the temperature of the capacity element. The control device includes voltage variation estimation means for estimating voltage variation corresponding to a detection value of the temperature of the capacity element by previously setting a relationship between the voltage variation generated in the equivalent series resistance and the temperature of the capacity element and referring to the set relationship; first setting means for setting a first upper limit value based on the element withstand voltage of the switching element and a surge voltage superimposed on the input voltage when a detection value of the temperature of the switching element is not less than a predetermined threshold value; and second setting means for setting a second upper limit value by decreasing the first upper limit value by a voltage corresponding to the voltage variation estimated by the voltage variation estimation means when the detection value of the temperature of the switching element is lower than the predetermined threshold value.

According to the load drive device described above, when the temperature of the switching element is low, the upper limit value is decreased by the amount corresponding to the voltage variation by the capacity element from the upper limit value at the time when the temperature of the switching element is high. Consequently, the allowable range of the surge voltage can be prevented from being narrowed.

According to another aspect of the present invention, a load drive device includes a DC power supply configured to allow an output voltage to be variably controlled; a drive circuit converting a DC voltage from the DC power supply into an AC voltage by a switching operation of a switching element to drive-control an electric load; a capacity element provided between the DC power supply and the drive circuit and smoothing the output voltage of the DC power supply for inputting to the drive circuit; and a control device controlling the DC power supply. The capacity element has a temperature dependence that a resistance value of an equivalent series resistance increases with a decrease in temperature of the capacity element. The switching element has a temperature dependence that an element withstand voltage decreases with a decrease in temperature of the switching element. In response to a request from the electric load, the control device sets the output voltage of the DC voltage to a value of less than an upper limit value of an input voltage of the drive circuit set depending on the temperature of each of the capacity element and the switching element.

According to the load drive device described above, when the upper limit value of the input voltage of the drive circuit is set depending on the temperature of each of the capacity element and the switching element, the allowable range of the surge voltage superimposed on the input voltage can be ensured irrespective of the temperature of each of the capacity element and the switching element. Consequently, the switching loss of the drive circuit can be reliably reduced.

Preferably, the load drive device further includes a first temperature sensor detecting the temperature of the capacity element and a second temperature sensor detecting the temperature of the switching element. The control device includes voltage variation estimation means for estimating voltage variation corresponding to a detection value of the temperature of the capacity element by previously setting a relationship between the voltage variation generated in the equivalent series resistance and the temperature of the capacity element and referring to the set relationship; first setting means for setting a first upper limit value based on the element withstand voltage of the switching element and a surge voltage superimposed on the input voltage when at least one of the detection value of the temperature of the capacity element and a detection value of the temperature of the switching element is not less than a predetermined threshold value; and second setting means for setting a second upper limit value by decreasing the first upper limit value by a voltage corresponding to the voltage variation estimated by the voltage variation estimation means when the detection value of the temperature of the capacity element and the detection value of the temperature of the switching element are lower than the predetermined threshold value.

According to the load drive device described above, when one of the temperature of the capacity element and the temperature of the switching element is low, the upper limit value of the input voltage of the drive circuit is decreased by the amount corresponding to the voltage variation by the capacity element from the upper limit value at the time when the temperature of each of the capacity element and the switching element is high. Consequently, the allowable range of the surge voltage can be prevented from being narrowed.

Preferably, the control device further includes target value setting means for setting a target value of the output voltage based on a request output of the electric load; and target value correcting means for correcting the target value to a value of less than the upper limit value of the input voltage set by the upper limit value setting means.

According to the load drive device described above, the target value of the output voltage of the voltage converter is corrected to thereby allow the upper limit value of the input voltage of the drive circuit to be readily decreased.

Preferably, the capacity element is an electrolytic capacitor.

According to the load drive device described above, the electrolytic capacitor having the temperature characteristics that the equivalent series resistance increases with a decrease in temperature can be employed as a smoothing capacitor. Consequently, it is possible to downsize the device by taking advantage of the electrolytic capacitor that is compact in size and large in capacity.

According to the present invention, the vehicle includes one of the above-described load drive devices.

According to the vehicle described above, the reduction in the switching loss of the load drive device allows the fuel efficiency to be improved.

According to the present invention, the switching loss of the drive circuit can be reliably reduced, with the result that the fuel efficiency of the vehicle equipped with the load drive device according to the present invention can be improved.

BEST MODES FOR CARRYING OUT THE INVENTION

The embodiments of the present invention will be hereinafter described in detail with reference to the accompanying drawings, in which the same or corresponding components are designated by the same reference characters.

Figure 1:
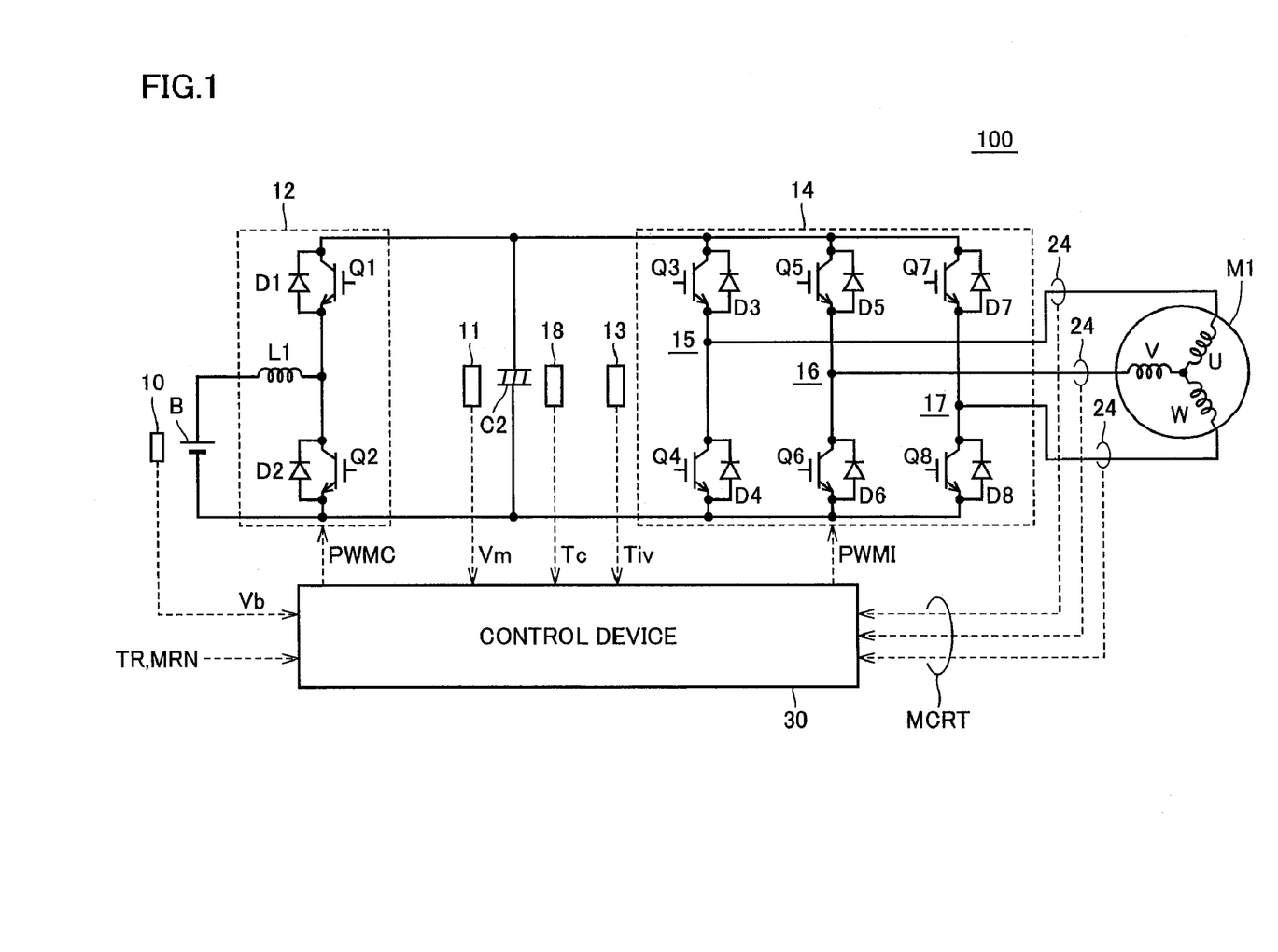
FIG. 1 is a schematic block diagram of a motor drive device to which a load drive device according to an embodiment of the present invention is applied.

FIG. 1 is a schematic block diagram of a motor drive device to which the load drive device according to an embodiment of the present invention is applied.

Referring to FIG. 1, a motor drive device 100 includes a DC power supply B, voltage sensors 10, 11, a current sensor 24, a capacitor C2, a boost converter 12, an inverter 14, temperature sensors 13, 18, and a control device 30.

An AC motor M1 is a drive motor for generating the torque for driving the driving wheels of the hybrid vehicle or the electric vehicle. AC motor M1 also serves as a motor that can operate to perform a function of the power generator driven by the engine and also operate as an electric motor for the engine, for example, to start the engine.

Boost converter 12 includes a reactor L1, IGBT elements Q1, Q2, and diodes D1, D2.

Reactor L1 has one end connected to a power supply line of DC power supply B and the other end connected to the intermediate point between IGBT element Q1 and IGBT element Q2, that is, connected between the emitter of IGBT element Q1 and the collector of IGBT element Q2.

IGBT elements Q1 and Q2 are connected in series between the power supply line and the ground line. IGBT element Q1 has a collector connected to the power supply line, and the IGBT element Q2 has an emitter connected to the ground line. Diodes D1, D2 are provided between the collector and the emitter of each of IGBT elements Q1, Q2, respectively, to cause a current to flow from the emitter side to the collector side.

Inverter 14 includes a U-phase arm 15, a V-phase arm 16 and a W-phase arm 17. U-phase arm 15, V-phase arm 16 and W-phase arm 17 are provided in parallel between the power supply line and the ground line.

U-phase arm 15 includes IGBT elements Q3, Q4 connected in series, V-phase arm 16 includes IGBT elements Q5, Q6 connected in series, and W-phase arm 17 includes IGBT elements Q7, Q8 connected in series. Diodes D3-D8 are connected between the collector and the emitter of each of IGBT elements Q3-Q8, respectively, to cause a current to flow from the emitter side to the collector side.

The intermediate point of each phase arm is connected to each phase end of each phase coil of AC motor M1. In other words, AC motor M1 is a three-phase permanent magnet motor, in which three coils of the U-, V- and W-phases each have one end connected in common to a neutral point. The U-phase coil has the other end connected to the intermediate point between IGBT elements Q3 and Q4, the V-phase coil has the other end connected to the intermediate point between IGBT elements Q5 and Q6, and the W-phase coil has the other end connected to the intermediate point between IGBT elements Q7 and Q8.

DC power supply B includes a secondary battery such as a nickel hydrogen battery or a lithium-ion battery. Voltage sensor 10 detects a voltage Vb output from DC power supply B and outputs the detected voltage Vb to control device 30.

Boost converter 12 boosts the DC voltage supplied from DC power supply B and supplies the voltage to capacitor C2. More specifically, when receiving a signal PWMC from control device 30, boost converter 12 boosts the DC voltage depending on the period during which IGBT element Q2 is being turned on by signal PWMC and supplies the voltage to capacitor C2.

When receiving signal PWMC from control device 30, boost converter 12 lowers the DC voltage supplied from inverter 14 through capacitor C2 and supplies the voltage to DC power supply B.

Capacitor C2 smoothes the DC voltage output from boost converter 12 and supplies the smoothed DC voltage to inverter 14. For example, an aluminum electrolytic capacitor that can be decreased in size and increased in capacity is used for capacitor C2.

Voltage sensor 11 detects a voltage Vm on both ends of capacitor C2 and outputs the detected voltage Vm to control device 30. Temperature sensor 18 detects a temperature of capacitor C2 (referred to as a "capacitor temperature") Tc and outputs the detected capacitor temperature Tc to control device 30.

When receiving the DC voltage from capacitor C2, inverter 14 converts the DC voltage into an AC voltage based on a signal PWMI from control device 30 and drives AC motor M1. This causes AC motor M1 to be driven so as to generate the torque designated by a torque command value TR.

During regenerative braking of the hybrid vehicle or the electric vehicle equipped with motor drive device 100, inverter 14 converts the AC voltage generated by AC motor M1 into a DC voltage based on signal PWMI from control device 30 and supplies the converted DC voltage to boost converter 12 through capacitor C2.

It is to be noted that the regenerative braking described herein includes a braking operation involving regeneration in the case of the foot brake operation by the driver of the hybrid vehicle or the electric vehicle and decelerating (or stopping acceleration) while performing regeneration by releasing the accelerator pedal during vehicle running without a foot brake operation.

Current sensor 24 detects a motor current MCRT flowing through AC motor M1 and outputs the detected motor current MCRT to control device 30.

Temperature sensor 13 detects a temperature of inverter 14 (referred to as an "inverter temperature") Tiv and outputs the detected inverter temperature Tiv to control device 30.

Control device 30 receives torque command value TR and a motor rotation speed MRN from an externally provided electrical control unit (ECU), receives voltage Vm from voltage sensor 11 and receives motor current MCRT from current sensor 24. Based on voltage Vm, torque command value TR and motor current MCRT, control device 30 generates signal PWMI for switching-controlling IGBT elements Q3-Q8 of inverter 14 when inverter 14 drives AC motor M1 by the method described below, and outputs the generated signal PWMI to inverter 14.

Based on voltages Vb, Vm, torque command value TR and motor rotation speed MRN, control device 30 generates signal PWMC for switching-controlling IGBT elements Q1, Q2 of boost converter 12 when inverter 14 drives AC motor M1 by the method described below, and outputs the generated signal PWMC to boost converter 12.

Furthermore, during regenerative braking of the hybrid vehicle or the electric vehicle equipped with motor drive device 100, based on voltage Vm, torque command value TR and motor current MCRT, control device 30 generates signal PWMI for converting the AC voltage generated by AC motor M1 into a DC voltage and outputs the generated signal PWMI to inverter 14. In this case, IGBT elements Q3-Q8 of inverter 14 are switching-controlled by signal PWMI. Thus, inverter 14 converts the AC voltage generated by AC motor M1 into a DC voltage and supplies the voltage to boost converter 12.

Furthermore, during regenerative braking, control device 30 generates signal PWMC for lowering the DC voltage supplied from inverter 14 based on voltages Vb, Vm, torque command value TR and motor rotation speed MRN, and outputs the generated signal PWMC to boost converter 12. Consequently, the AC voltage generated by AC motor M1 is converted into a DC voltage which is then lowered and supplied to DC power supply B.

Figure 2:
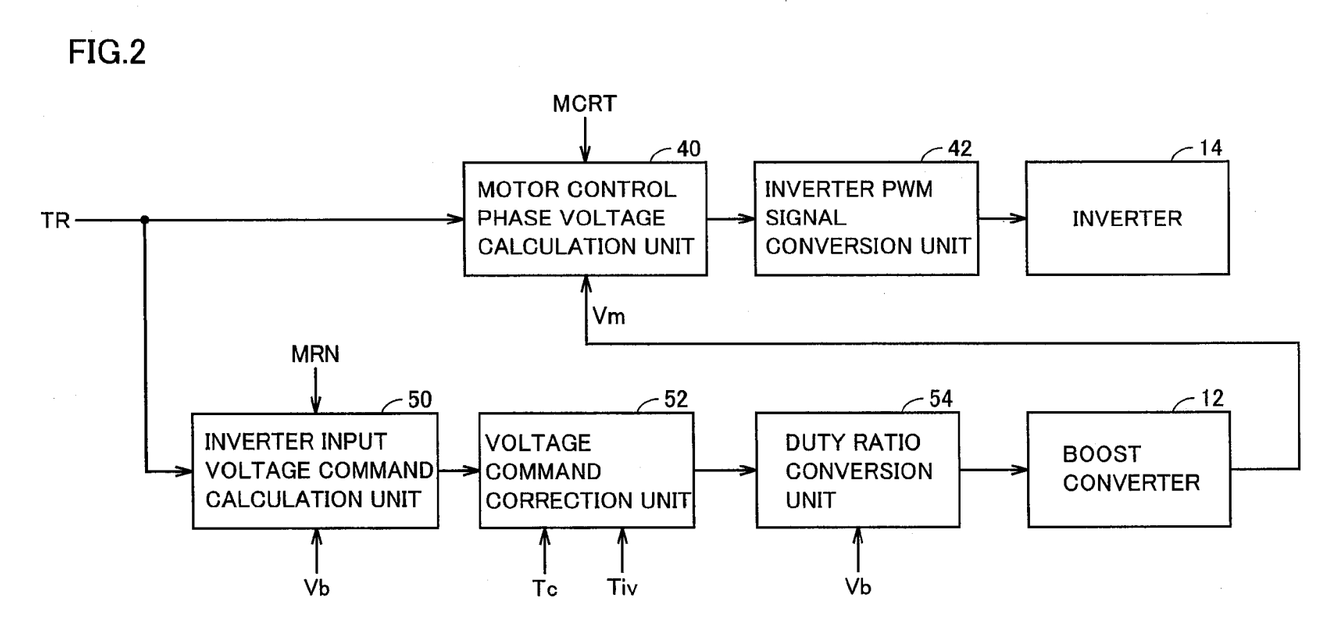
FIG. 2 is a block diagram of a control device in FIG. 1.

FIG. 2 is a block diagram of control device 30 in FIG. 1.

Referring to FIG. 2, control device 30 includes a motor control phase voltage calculation unit 40, an inverter PWM signal conversion unit 42, an inverter input voltage command calculation unit 50, a voltage command correction unit 52, and a duty ratio conversion unit 54.

Motor control phase voltage calculation unit 40 receives torque command value TR from the external ECU, receives output voltage Vm of boost converter 12, that is, the input voltage of inverter 14 from voltage sensor 11, and receives motor current MCRT from current sensor 24. Motor control phase voltage calculation unit 40 calculates the voltage applied to each phase of AC motor M1 based on these input signals and outputs the calculated results to inverter PWM signal conversion unit 42.

Based on the calculation results received from motor control phase voltage calculation unit 40, inverter PWM signal conversion unit 42 generates signal PWMI for actually turning on/off each of IGBT elements Q3-Q8 of inverter 14 and outputs the generated signal PWMI to each of IGBT elements Q3-Q8 of inverter 14.

Consequently, each of IGBT elements Q3-Q8 is switching-controlled and controls the current flowing through each phase of AC motor M1 such that AC motor M1 outputs the commanded torque. In this way, the motor driving current is controlled and the motor torque in accordance with torque command value TR is output.

Inverter input voltage command calculation unit 50 calculates the optimum value (target value) of the inverter input voltage, that is, a voltage command Vdc_com based on torque command value TR and motor rotation speed MRN from the external ECU, and outputs the calculated voltage command Vdc_com to voltage command correction unit 52.

Voltage command correction unit 52 receives voltage command Vdc_com from inverter input voltage command calculation unit 50, receives capacitor temperature Tc from temperature sensor 18, and receives inverter temperature Tiv from temperature sensor 13. Voltage command correction unit 52 corrects voltage command Vdc_com based on capacitor temperature Tc and inverter temperature Tiv from temperature sensor 18 by the method described below, and outputs a corrected voltage command Vdc_com1 to duty ratio conversion unit 54.

When receiving corrected voltage command Vdc_com1 from voltage command correction unit 52 and receiving DC voltage Vb from voltage sensor 10, duty ratio conversion unit 54 calculates a duty ratio for setting output voltage Vm from voltage sensor 11 to voltage command Vdc_com1, and generates signal PWMC for turning on/off IGBT elements Q1, Q2 of boost converter 12 based on the calculated duty ratio. Duty ratio conversion unit 54 then outputs the generated signal PWMC to IGBT elements Q1, Q2 of boost converter 12.

The on-duty of IGBT element Q2 on the lower side of boost converter 12 is increased to thereby cause an increase in power storage of reactor L1, which allows a higher voltage output to be obtained. On the other hand, the on-duty of IGBT element Q1 on the upper side is increased to thereby cause a decrease in the voltage on the power supply line. Thus, the duty ratio of each of IGBT elements Q1, Q2 is controlled to thereby allow an input voltage Vm of inverter 14 to be controlled to an arbitrary voltage up to the upper limit value set based on the element withstand voltage of the IGBT element and the like as a lower limit of the output voltage of DC power supply B. It is to be noted that the upper limit value of input voltage Vm is set based on the element withstand voltage of the IGBT element and the surge voltage generated at the time of the switching operation, as described below.

Boost converter 12 is thus controlled to cause input voltage Vm of inverter 14 to be varied depending on the operation state of AC motor M1, with the result that the loss (including motor loss, inverter loss, boost converter loss) caused in motor drive device 100 can be minimized and the motor driving efficiency can be enhanced.

By the switching operation of each of IGBT elements Q3-Q8, inverter 14 converts input voltage Vm converted into a high voltage of not less than the output voltage of DC power supply B into an AC voltage for driving AC motor M1.

In this case, at the time of the switching operation of each of IGBT elements Q3-Q8, the surge voltage is generated when the IGBT elements are switched from on to off. This surge voltage is applied between the collector and the emitter of each IGBT element that is superimposed on input voltage Vm of inverter 14 and caused to be in the off-state. Accordingly, in order to prevent breakdown of the IGBT element, it is necessary to limit the sum of input voltage Vm of inverter 14 and the surge voltage to the level of not more than the element withstand voltage of the IGBT element.

Figure 3:
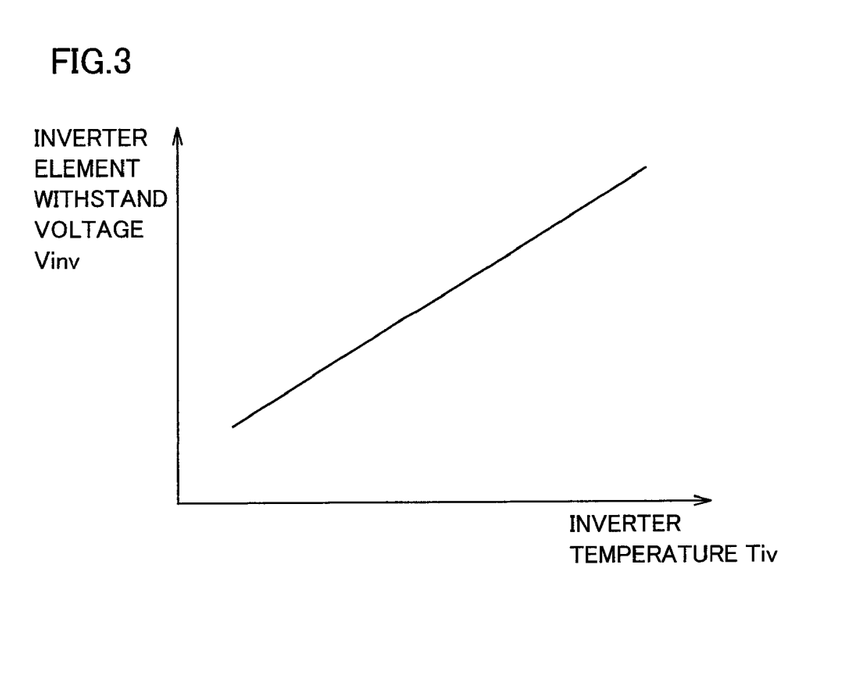
FIG. 3 shows the relationship between an element withstand voltage Vinv of an IGBT element and an inverter temperature Tiv.

FIG. 3 shows the relationship between an element withstand voltage Vinv of the IGBT element and inverter temperature Tiv.

Referring to FIG. 3, element withstand voltage Vinv of the IGBT element decreases with a decrease in inverter temperature Tiv. Therefore, the lower the inverter temperature Tiv is, the more the surge voltage should be decreased under the constraint of element withstand voltage Vinv.

Furthermore, inverter 14 has capacitor C2 provided on its input side, through which ripple current flows in accordance with the switching control of IGBT elements Q1, Q2 of boost converter 12. Consequently, the voltage obtained by the product of the ESR and the ripple current is generated across the terminals of the ESR. This voltage is superimposed on input voltage Vm of inverter 14 as voltage variation ΔVc.

Figure 4:
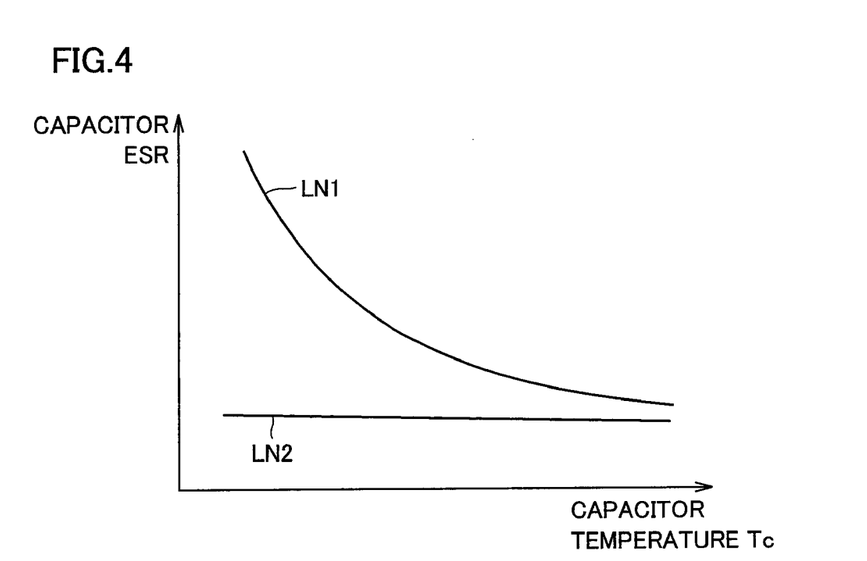
FIG. 4 shows the relationship between an ESR of a capacitor and a capacitor temperature Tc.

FIG. 4 shows the relationship between the ESR and capacitor temperature Tc of capacitor C2.

Referring to FIG. 4, a line LN1 shows the temperature dependence of the ESR at the time when an aluminum electrolytic capacitor is applied for capacitor C2. A line LN2 shows the temperature dependence of the ESR at the time when a film capacitor is applied for capacitor C2.

As seen from FIG. 4, in the case where the aluminum electrolytic capacitor is used for capacitor C2, the ESR increases with a decrease in capacitor temperature Tc. Therefore, it becomes apparent that voltage variation ΔVc superimposed on input voltage Vm of inverter 14 is increased with a decrease in capacitor temperature Tc.

It is to be noted that when the film capacitor is used for capacitor C2, the ESR is maintained at an approximately constant value irrespective of capacitor temperature Tc, which allows voltage variation ΔVc to be kept small. However, the film capacitor is inferior to the aluminum electrolytic capacitor that is compact in size and large in capacity. It is therefore considered that, as compared to the aluminum electrolytic capacitor, it is disadvantageous to apply the film capacitor to capacitor C2 that requires a decrease in size and in profile because of its constraints on the installation to the vehicle. Thus, the load drive device according to the present embodiments will be described focusing on the configuration employing the aluminum electrolytic capacitor for capacitor C2.

As described above, when the element temperature (inverter temperature Tiv and capacitor temperature Tc) is low, element withstand voltage Vinv of the IGBT element decreases while voltage variation ΔVc by capacitor C2 increases. Therefore, input voltage Vm of inverter 14 is allowed to be set up to the voltage as high as that at the time when the element temperature is high, with the result that the allowable surge voltage will be limited in magnitude.

Consequently, since the switching loss of inverter 14 increases so as to be inversely proportional to the limitation on the surge voltage, it is difficult to sufficiently obtain the effects of the loss reduction caused by the variable voltage system using boost converter 12.

Figure 5:
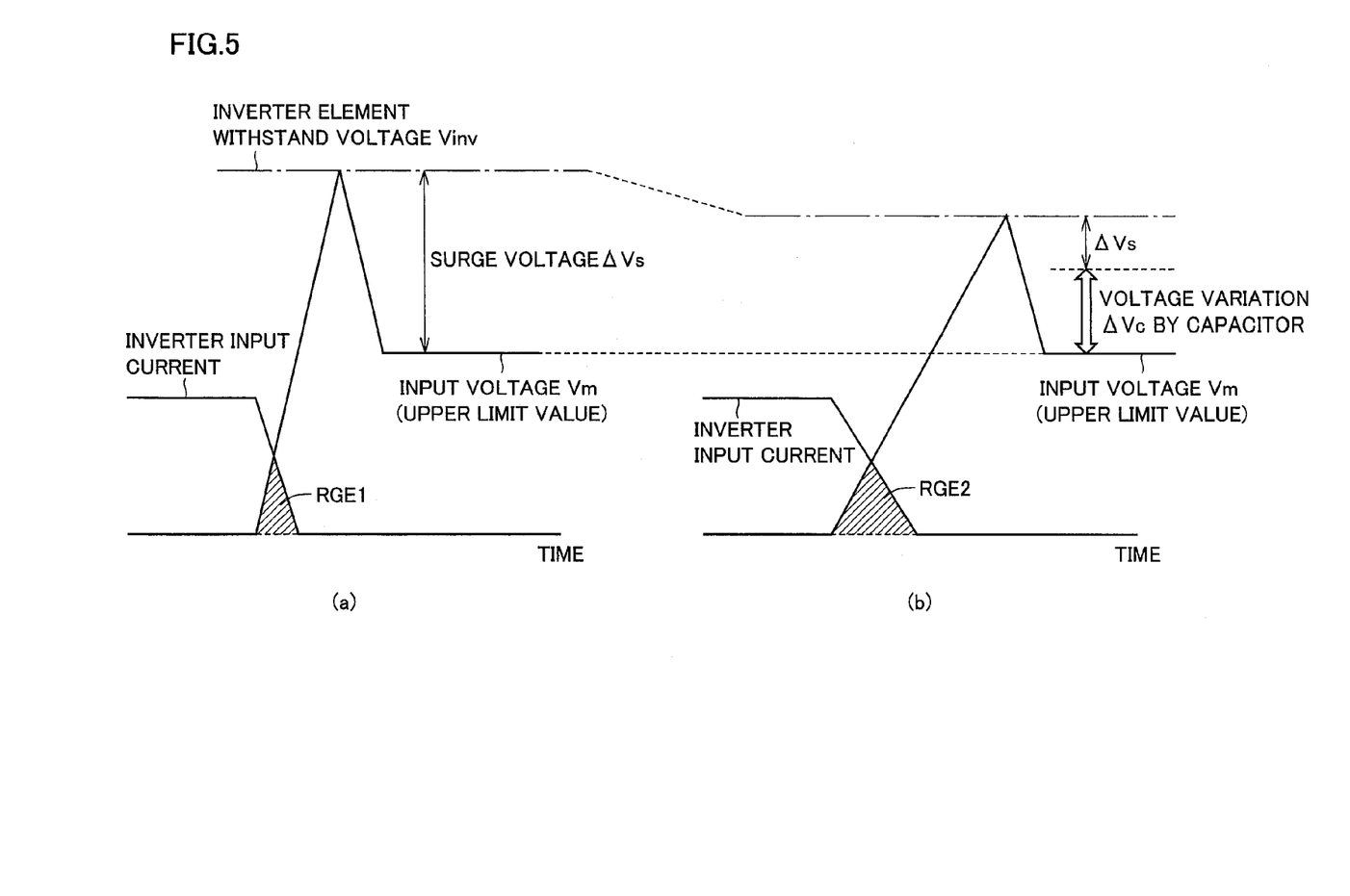
FIG. 5 is a diagram illustrating the relationship between the input voltage, the surge voltage and the switching loss of the inverter, and the element temperature.

FIG. 5 is a diagram illustrating the relationship between input voltage Vm, the surge voltage and the switching loss of inverter 14, and the element temperature. FIG. 5(a) shows a timing chart of input voltage Vm and the input current of inverter 14 at the time when the element temperature (inverter temperature Tiv and capacitor temperature Tc) is relatively high. FIG. 5(b) shows a timing chart of input voltage Vm and the input current of inverter 14 at the time when the element temperature is relatively low.

Referring to FIG. 5(a), when the IGBT element is changed from the on-state to the off-state, a surge voltage ΔVs and the switching loss are generated. The magnitude of this surge voltage ΔVs depends on the turning-off period during which the IGBT element is being switched from the on-state to the off-state, that is, the switching speed. Thus, the surge voltage increases with an increase in the switching speed.

The switching loss is obtained by the multiplication integral value of input voltage Vm and the input current of inverter 14 and corresponds to the area of a region RGE1 in the figure. As the switching speed is increased, the area of region RGE1 is decreased accordingly, and therefore, the switching loss can be suppressed.

Accordingly, when the element temperature is high as in FIG. 5(a), the settable upper limit value of input voltage Vm of inverter 14 is set such that surge voltage ΔVs having a magnitude sufficient to reduce the switching loss can be generated with respect to element withstand voltage Vinv of the IGBT element. The switching speed is increased as much as possible within the allowable range of this surge voltage ΔVs, which allows the switching loss to be kept low.

On the other hand, the element temperature is low as in FIG. 5(b), element withstand voltage Vinv of the IGBT element is decreased in accordance with the relationship shown in FIG. 3. Furthermore, the ESR of capacitor C2 is increased in accordance with the relationship in FIG. 4 described above, to thereby cause the voltage across the terminals of the ESR to be increased, and the voltage across the terminals is superimposed on input voltage Vm as voltage variation ΔVc. Accordingly, as compared to the case of a high temperature, strict limitations are imposed on the voltage range of surge voltage ΔVs that is accepted for obtaining input voltage Vm of the same level as that at the time when the element temperature is high. Therefore, in this limited voltage range, the switching speed cannot be raised to the same level as that at a high temperature, with the result that the switching loss is increased as compared to the case of a high temperature, as shown in a region RGE2 in the figure.

Accordingly, in order to suppress the increase in the switching loss at a low temperature, the load drive device according to the present invention is configured such that the settable upper limit value of input voltage Vm of inverter 14 is varied depending on the element temperature, which will be described as follows.

Figure 6:
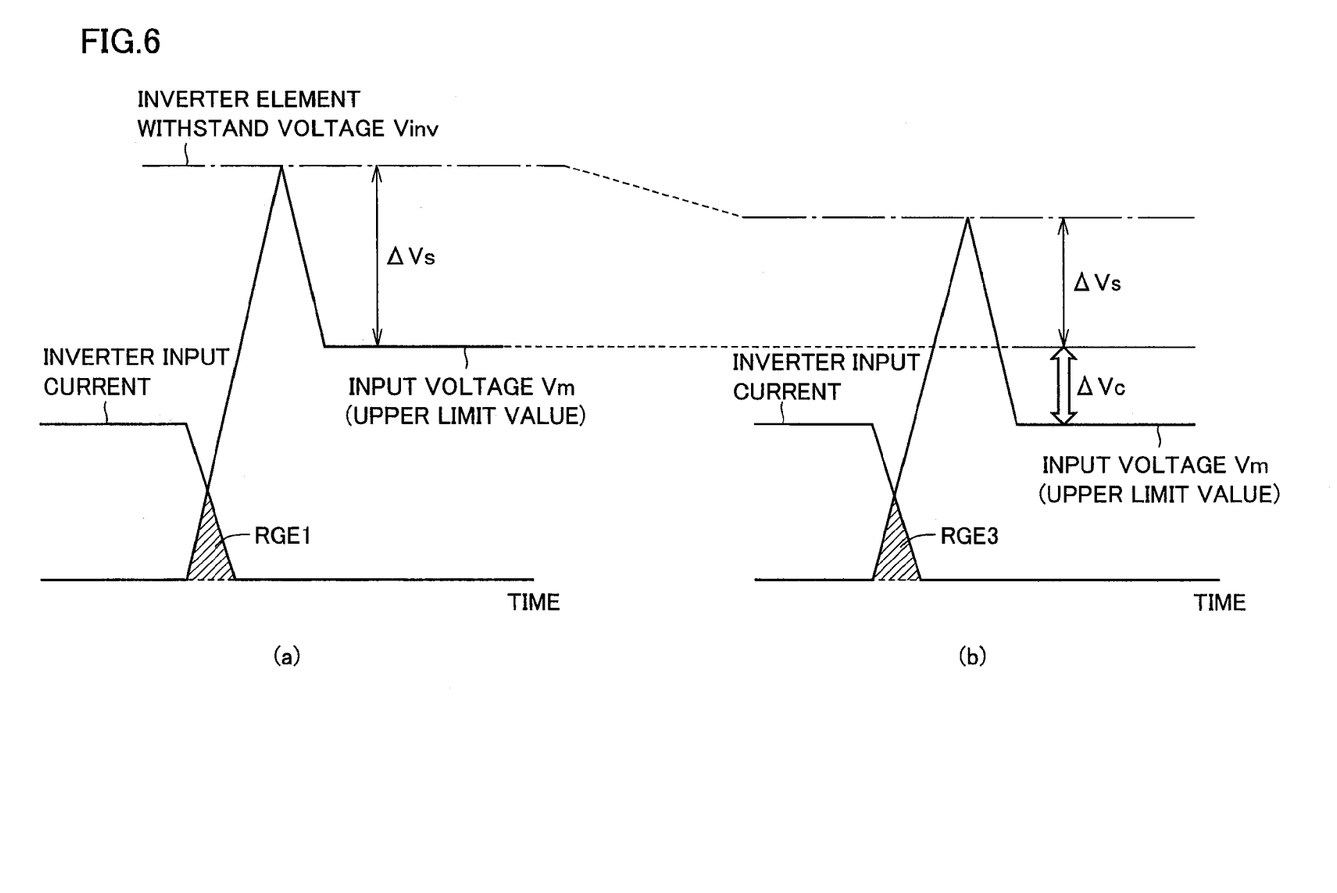
FIG. 6 is a diagram illustrating the relationship between the input voltage, the surge voltage and the switching loss of the inverter, and the element temperature in accordance with the present invention.

FIG. 6 is a diagram illustrating the relationship between input voltage Vm, the surge voltage and the switching loss of inverter 14, and the element temperature in accordance with the present invention. It is to be noted that FIG. 6(a) shows a timing chart of input voltage Vm and the input current of inverter 14 at the time when the element temperature (inverter temperature Tiv and capacitor temperature Tc) is relatively high, and is the same as that in FIG. 5(a) described above.

Furthermore, in FIG. 6(a), input voltage Vm of inverter 14 has its upper limit value set based on element withstand voltage Vinv of the IGBT element and surge voltage ΔVs, as described above.

FIG. 6(b) shows a timing chart of input voltage Vm and the input current of inverter 14 at the time when the element temperature is relatively low.

Referring to FIG. 6(b), the load drive device according to the present invention is configured such that, when the element temperature is lower than the predetermined threshold value, the settable upper limit value of input voltage Vm of inverter 14 is decreased by voltage variation ΔVc by capacitor C2 from the upper limit value of input voltage Vm at the time when the element temperature is not less than the predetermined threshold value.

This configuration allows the generation of surge voltage ΔVs that is the same level as that at a high temperature, even in the low temperature environment where element withstand voltage Vinv of the IGBT element is decreased and voltage variation ΔVc by capacitor C2 is increased. Consequently, the switching speed is raised as much as possible within the allowable range, with the result that the switching loss can be reduced to the level equal to that at a high temperature, as shown in a region RGE3 in the figure.

On the other hand, according to the load drive device in accordance with the present invention, when the element temperature is lower than the predetermined threshold value, the upper limit value of input voltage Vm of inverter 14 is limited, which may cause a problem that the output of AC motor M1 fails to achieve the request output.

However, each of IGBT elements Q3-Q8 of inverter 14 receives input voltage Vm and performs the switching operation, to thereby cause each of IGBT elements Q3-Q8 to be energized to increase the switching loss and the steady loss. As a result, inverter temperature Tiv can be raised to a value of not less than the predetermined threshold value in a short period of time.

Furthermore, when boost converter 12 performs the boost operation, capacitor C2 is energized to increase heat loss in the ESR. Consequently, capacitor temperature Tc can be raised to a value of not less than the predetermined threshold value in a short period of time. Therefore, it can be said that the period during which input voltage Vm of inverter 14 is limited is short enough to avoid insufficient output torque of AC motor M1.

Furthermore, the limitation imposed on the upper limit value of input voltage Vm of inverter 14 causes a decrease in the maximum possible output torque of AC motor M1. However, in view of the fact that the request torque of AC motor M1 is less likely to be set as a maximum torque in a short period of time during which the element temperature reaches the predetermined threshold value, it can be considered that the above-described limitation on input voltage Vm has little effect on the output characteristics of AC motor M1.

The control operation of input voltage Vm of inverter 14 according to the present invention illustrated in FIG. 6 will then be described in detail. In the following description, input voltage Vm is controlled by voltage command correction unit 52 in control device 30 in FIG. 2 correcting voltage command Vdc_com set based on the request output of AC motor M1 in accordance with at least one of inverter temperature Tiv and capacitor temperature Tc provided from temperature sensors 13, 18, respectively.

Figure 7:
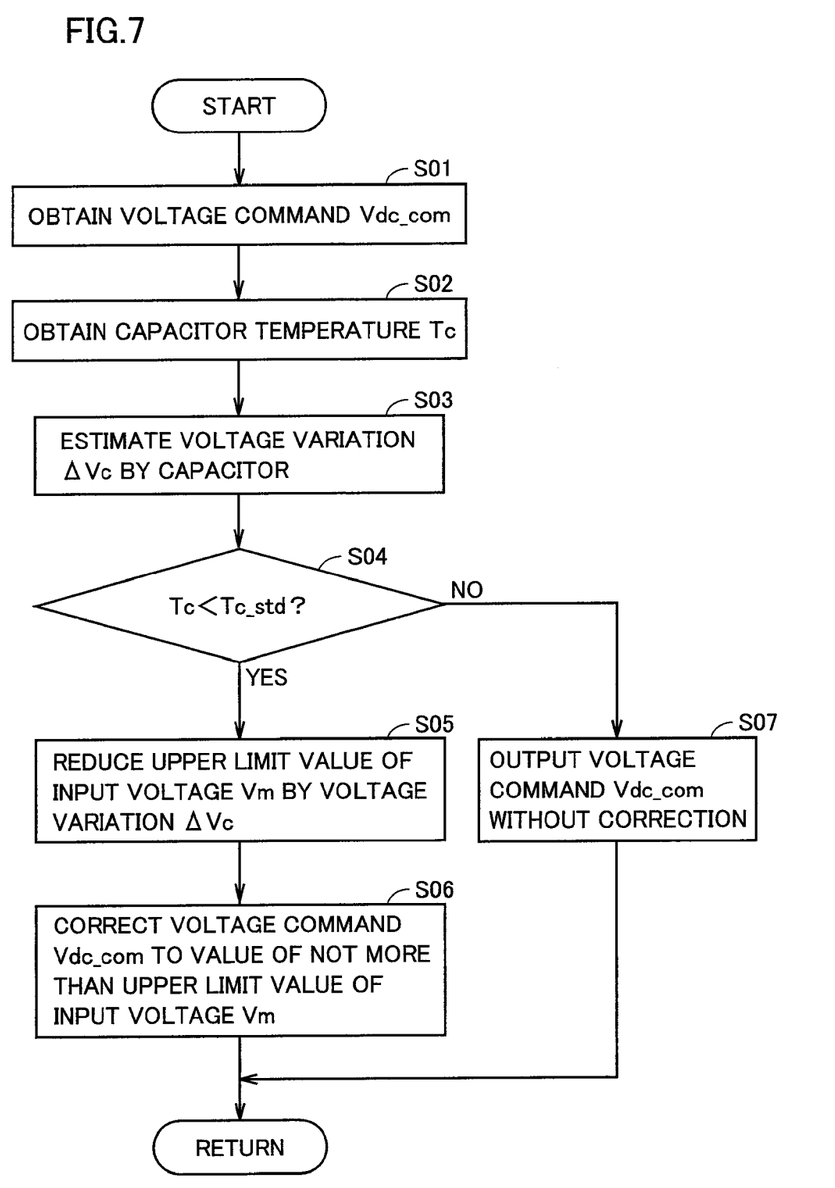
FIG. 7 is a flowchart describing the control of the input voltage of the inverter in accordance with an embodiment of the present invention.

FIG. 7 is a flowchart describing the control of input voltage Vm of inverter 14 in accordance with the embodiment of the present invention. It is to be noted that the flowchart in FIG. 7 shows the control operation in the case where input voltage Vm is variably controlled depending on capacitor temperature Tc.

Referring to FIG. 7, when a series of operations are started, inverter input voltage command calculation unit 50 calculates voltage command Vdc_com which is a target value of inverter input voltage Vm based on torque command value TR and motor rotation speed MRN from the external ECU. It is to be noted that, in the case of the calculation of voltage command Vdc_com, the upper limit value of input voltage Vm of inverter 14 is set in advance based on element withstand voltage Tinv of the IGBT element and surge voltage ΔVs. Voltage command Vdc_com assumes its set upper limit value as a maximum value. The calculated voltage command Vdc_com is output to voltage command correction unit 52 (step S01).

When receiving capacitor temperature Tc from temperature sensor 18 (step S02), voltage command correction unit 52 estimates voltage variation ΔVc by capacitor C2 based on capacitor temperature Tc (step S03).

Figure 8:
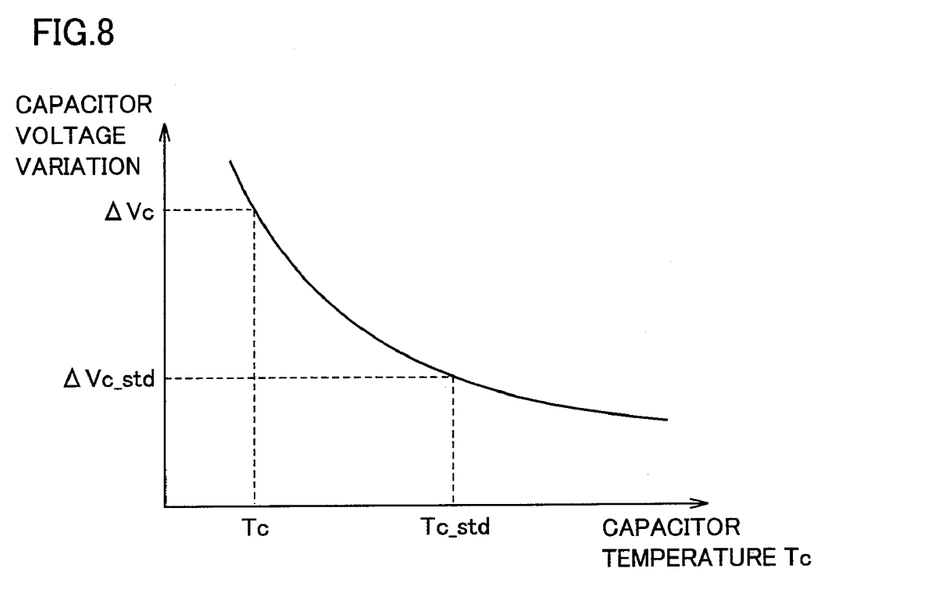
FIG. 8 is a diagram illustrating the relationship between voltage variation $\Delta Vc$ by the capacitor and capacitor temperature Tc.

Specifically, voltage command correction unit 52 previously possesses, as a map, the relationship between voltage variation ΔVc by capacitor C2 and capacitor temperature Tc shown in FIG. 8. It is to be noted that the relationship shown in FIG. 8 is set based on the relationship between the ESR and capacitor temperature Tc of capacitor C2 shown in FIG. 4 as described above and the ripple current of capacitor C2 which is experimentally obtained in advance. When receiving capacitor temperature Tc from temperature sensor 18, voltage command correction unit 52 extracts voltage variation ΔVc corresponding to capacitor temperature Tc from the map in FIG. 8.

Voltage command correction unit 52 then determines whether capacitor temperature Tc is lower than a predetermined threshold value Tc_std (step S04). It is to be noted that predetermined threshold value Tc_std is set in advance to capacitor temperature Tc at the time when voltage variation ΔVc is not more than a predetermined threshold value ΔVc_std in terms of the relationship in FIG. 8. When it is determined that capacitor temperature Tc is not less than predetermined threshold value Tc_std, voltage command correction unit 52 outputs voltage command Vdc_com to duty ratio conversion unit 54 without correction (step S07).

In step S04, if it is determined that capacitor temperature Tc is lower than predetermined threshold value Tc_std, voltage command correction unit 52 first reduces the upper limit value of input voltage Vm of inverter 14 by voltage variation ΔVc estimated in step S03 (step S05). Voltage command correction unit 52 then corrects voltage command Vdc_com to a value of not more than the upper limit value of input voltage Vm reduced in step S05, and outputs the corrected voltage command Vdc_com1 to duty ratio conversion unit 54 (step S06).

In this way, when capacitor temperature Tc is lower than predetermined threshold value Tc_std, voltage command Vdc_com is corrected so as to reduce the upper limit value of input voltage Vm of inverter 14 by voltage variation ΔVc by capacitor C2, and boost converter 12 is then driven. Boost converter 12 is driven such that the voltage corresponding to voltage command Vdc_com is supplied to inverter 14 depending on the fact that capacitor temperature Tc is increased to a value of not less than predetermined threshold value Tc_std and voltage variation ΔVc is reduced. As a result, it becomes possible to prevent the allowable range of the surge voltage from being narrowed due to voltage variation ΔVc when capacitor C2 is low in temperature. Consequently, the switching loss of inverter 14 can be reliably reduced irrespective of capacitor temperature Tc.

[Modification 1]

Figure 9:
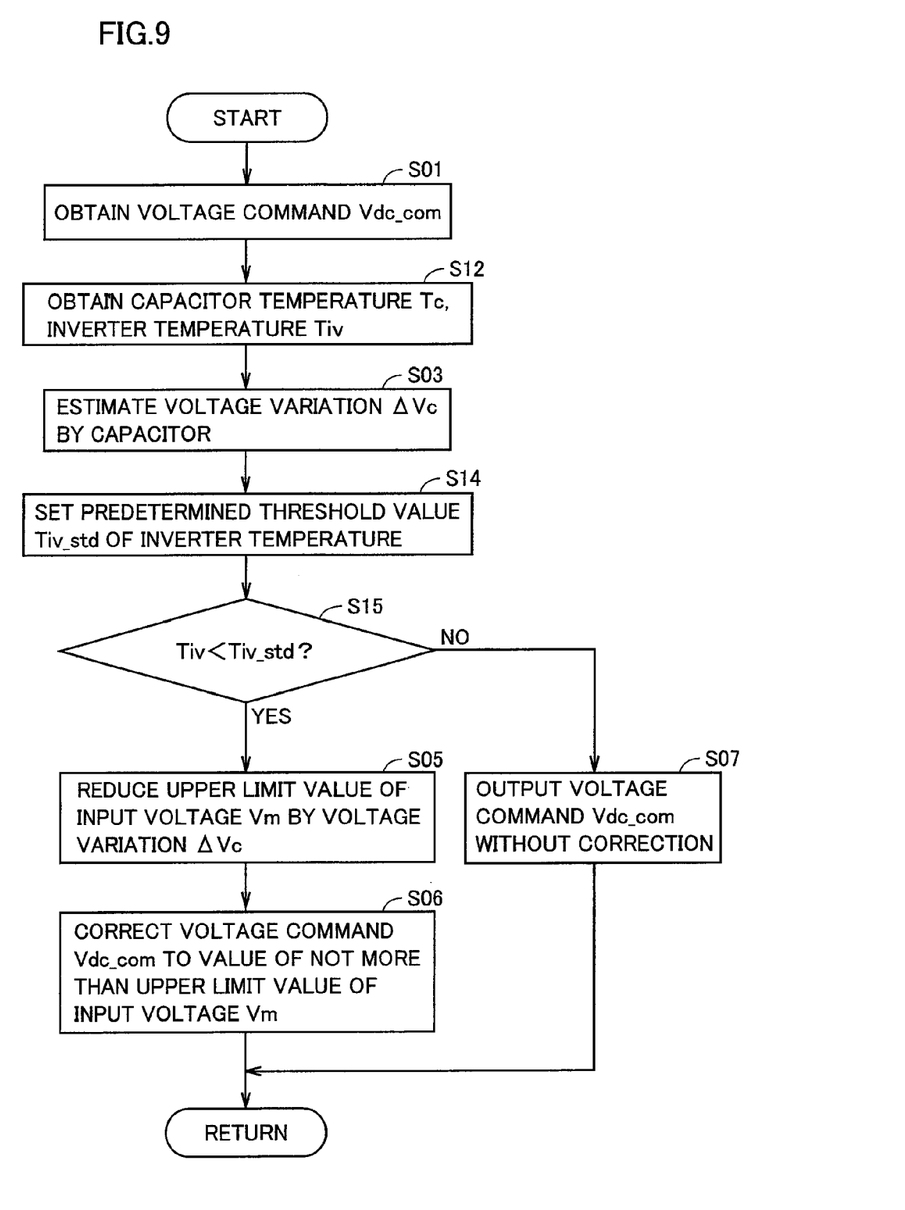
FIG. 9 is another flowchart describing the control of the input voltage of the inverter in accordance with the embodiment of the present invention.

FIG. 9 is another flowchart describing the control of input voltage Vm of inverter 14 in accordance with the embodiment of the present invention.

The flowchart shown in FIG. 9 is modified such that the variable control of input voltage Vm depending on capacitor temperature Tc in the flowchart shown in FIG. 7 is performed depending on inverter temperature Tiv.

Referring to FIG. 9, when a series of operations are started, inverter input voltage command calculation unit 50 calculates voltage command Vdc_com that is a target value of inverter input voltage Vm based on torque command value TR and motor rotation speed MRN from the external ECU. The calculated voltage command Vdc_com is output to voltage command correction unit 52 (step S01).

Voltage command correction unit 52 receives voltage command Vdc_com from inverter input voltage command calculation unit 50, receives capacitor temperature Tc from temperature sensor 18 and receives inverter temperature Tiv from temperature sensor 13 (step S12). Voltage command correction unit 52 extracts voltage variation ΔVc corresponding to capacitor temperature Tc from the map in FIG. 8 by the above-described method (step S03).

Furthermore, voltage command correction unit 52 previously possesses, as a map, the relationship between element withstand voltage Vinv and inverter temperature Tiv of inverter 14 shown in FIG. 3, and refers to the map to obtain element withstand voltage Vinv corresponding to inverter temperature Tiv. Voltage command correction unit 52 then extracts, from the map, element temperature Tiv at the time when the obtained element withstand voltage Vinv increases by voltage variation ΔVc estimated in step S03, and sets the extracted inverter temperature Tiv as a predetermined threshold value Tiv_std (step S14).

Voltage command correction unit 52 then determines whether inverter temperature Tiv is lower than predetermined threshold value Tiv_std (step S15). If it is determined that inverter temperature Tiv is not less than predetermined threshold value Tiv_std, voltage command correction unit 52 outputs voltage command Vdc_com to duty ratio conversion unit 54 without correction (step S07).

In step S15, if it is determined that inverter temperature Tiv is lower than predetermined threshold value Tiv_std, voltage command correction unit 52 first reduces the upper limit value of input voltage Vm of inverter 14 by voltage variation ΔVc estimated in step S03 (step S05). Voltage command correction unit 52 then corrects voltage command Vdc_com to a value of not more than the upper limit value of input voltage Vm set in step S015, and outputs the corrected voltage command Vdc_com1 to duty ratio conversion unit 54 (step S06).

In this way, when inverter temperature Tiv is lower than predetermined threshold value Tiv_std, voltage command Vdc_com is corrected to reduce the upper limit value of input voltage Vm of inverter 14 by voltage variation ΔVc by capacitor C2, and boost converter 12 is driven. Boost converter 12 is driven such that the voltage corresponding to voltage command Vdc_com is supplied to inverter 14 depending on the fact that inverter temperature Tiv is increased to a value of not less than predetermined threshold value Tiv_std and element withstand voltage Vinv is increased by an amount corresponding to voltage variation ΔVc. Consequently, it becomes possible to prevent the allowable range of the surge voltage from being narrowed due to voltage variation ΔVc when inverter 14 is low in temperature. This allows the switching loss of inverter 14 to be reliably reduced irrespective of inverter temperature Tiv.

[Modification 2]

Figure 10:
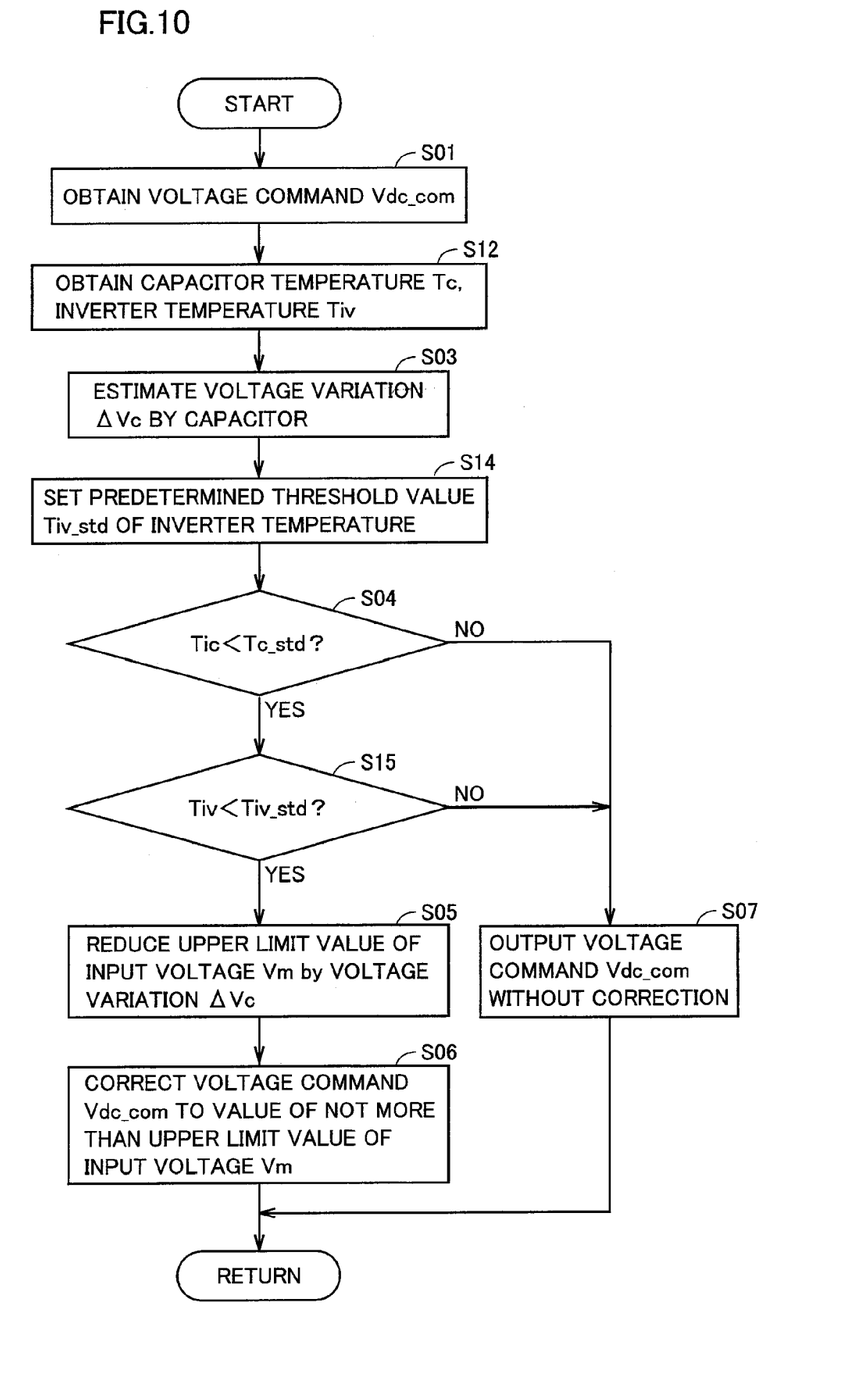
FIG. 10 is another flowchart describing the control of the input voltage of the inverter in accordance with the embodiment of the present invention.

FIG. 10 is another flowchart describing the control of input voltage Vm of inverter 14 in accordance with the embodiment of the present invention.

The flowchart shown in FIG. 10 is modified such that the variable control of input voltage Vm depending on capacitor temperature Tc in the flowchart shown in FIG. 7 is performed depending on capacitor temperature Tc and inverter temperature Tiv.

Referring to FIG. 10, when a series of operations are started, inverter input voltage command calculation unit 50 calculates voltage command Vdc_com that is a target value of inverter input voltage Vm based on torque command value TR and motor rotation speed MRN from the external ECU, and outputs the calculated voltage command Vdc_com to voltage command correction unit 52 (step S01).

Voltage command correction unit 52 receives voltage command Vdc_com from inverter input voltage command calculation unit 50, receives capacitor temperature Tc from temperature sensor 18 and receives inverter temperature Tiv from temperature sensor 13 (step S12). Voltage command correction unit 52 extracts voltage variation ΔVc corresponding to capacitor temperature Tc from the map in FIG. 8 by the above-described method (step S03).

Furthermore, voltage command correction unit 52 obtains element withstand voltage Vinv corresponding to inverter temperature Tiv from the map in FIG. 3. Voltage command correction unit 52 then extracts, from the map, element temperature Tiv at the time when the obtained element withstand voltage Vinv increases by voltage variation ΔVc detected in step S03, and sets the extracted inverter temperature Tiv as a predetermined threshold value Tiv_std (step S14).

Voltage command correction unit 52 then determines whether capacitor temperature Tc is lower than predetermined threshold value Tc_std (step S04). If it is determined that capacitor temperature Tc is lower than predetermined threshold value Tc_std, voltage command correction unit 52 further determines whether inverter temperature Tiv is lower than predetermined threshold value Tiv_std (step S15). If it is determined that inverter temperature Tiv is lower than predetermined threshold value Tiv_std, voltage command correction unit 52 first reduces the upper limit value of input voltage Vm of inverter 14 by voltage variation ΔVc estimated in step S03 (step S05). Voltage command correction unit 52 then corrects voltage command Vdc_com to a value of not more than the upper limit value of input voltage Vm set in step S05, and outputs the corrected voltage command Vdc_com1 to duty ratio conversion unit 54 (step S06).

If it is determined in step S04 that capacitor temperature Tc is not less than predetermined threshold value Tc_std, or if it is determined in step S15 that inverter temperature Tiv is not less than predetermined threshold value Tiv_std, voltage command correction unit 52 outputs voltage command Vdc_com to duty ratio conversion unit 54 without correction (step S07).

In this way, when capacitor temperature Tc and inverter temperature Tiv each are lower than the predetermined threshold value (Tc std or Tiv std), voltage command Vdc_com is corrected to reduce the upper limit value of input voltage Vm of inverter 14 by voltage variation ΔVc by capacitor C2, and boost converter 12 is driven.

In other words, according to the present modification, if one of capacitor temperature Tc and inverter temperature Tiv is not less than the predetermined threshold value, a series of operations for correcting voltage command Vdc_com are not performed. Accordingly, the operation frequency for correction can be reduced as compared to the case where input voltage Vm is variably controlled depending on one of capacitor temperature Tc and inverter temperature Tiv as in FIGS. 7 and 9. This allows the output performance of AC motor M1 to be less affected.

As described above, according to the embodiments of the present invention, it is possible to prevent the allowable voltage range of the surge voltage from being narrowed in the low temperature environment where the element withstand voltage of the inverter is decreased and the voltage variation by the ESR of the smoothing capacitor is increased. Consequently, the switching loss of the inverter can be reliably reduced.

Although the above embodiments have described the case where the IGBT is employed for the switching element of the inverter, it may be other power elements, for example, an NPN transistor and an MOS transistor.

Furthermore, while each of the above embodiments has representatively described the case where an aluminum electrolytic capacitor is used for capacitor C2, the present invention may be widely applied to the capacitors in general having a temperature dependence that the ESR increases with a decrease in the element temperature.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention can be applied to the load drive device mounted in the vehicle.

The invention claimed is:
1. A load drive device comprising:
a DC power supply configured to allow an output voltage to be variably controlled;
a drive circuit converting a DC voltage from said DC power supply into an AC voltage by a switching operation of a switching element to drive-control an electric load;
a capacity element provided between said DC power supply and said drive circuit and smoothing the output voltage of said DC power supply for inputting to said drive circuit; and
a control device controlling said DC power supply,
said capacity element having a temperature dependence such that a resistance value of an equivalent series resistance increases with a decrease in temperature of said capacity element, and
said control device setting an upper limit value of an input voltage of said drive circuit to a lower value depending on the decrease in the temperature of said capacity element, and, in response to a request from said electric load, setting the output voltage of said DC voltage to a value of less than the set upper limit value of said input voltage.

2. The load drive device according to claim 1, further comprising a first temperature sensor detecting the temperature of said capacity element, wherein
said control device includes
a voltage variation estimation device to estimate voltage variation corresponding to a detection value of the temperature of said capacity element by previously setting a relationship between the voltage variation generated in said equivalent series resistance and the temperature of said capacity element and referring to said set relationship,
a first setting device to set a first upper limit value based on an element withstand voltage of said switching element and a surge voltage superimposed on said input voltage when the detection value of the temperature of said capacity element is not less than a predetermined threshold value, and
a second setting device to set a second upper limit value by decreasing said first upper limit value by a voltage corresponding to said voltage variation estimated by said voltage variation estimation device when the detection value of the temperature of said capacity element is lower than said predetermined threshold value.

3. The load drive device according to claim 1, wherein said control device further includes
a target value setting device to set a target value of said output voltage based on a request output of said electric load, and
a target value correcting device to correct said target value to a value of less than said upper limit value.

4. The load drive device according to claim 3, wherein said capacity element is an electrolytic capacitor.

5. A load drive device comprising:
a DC power supply configured to allow an output voltage to be variably controlled;
a drive circuit converting a DC voltage from said DC power supply into an AC voltage by a switching operation of a switching element to drive-control an electric load;

a capacity element provided between said DC power supply and said drive circuit and smoothing the output voltage of said DC power supply for inputting to said drive circuit; and a control device controlling said DC power supply, said switching element having a temperature dependence such that an element withstand voltage decreases with a decrease in temperature of said switching element, and in response to a request from said electric load, said control device to set the output voltage of said DC voltage to a value of less than an upper limit value of an input voltage of said drive circuit set depending on the temperature of said switching element.

6. The load drive device according to claim 5, wherein said control device sets the upper limit value of said input voltage to a lower value depending on the decrease in the temperature of said switching element.

7. The load drive device according to claim 6, further comprising:

a first temperature sensor detecting temperature of said capacity element; and a second temperature sensor detecting the temperature of said switching element, wherein said capacity element has a temperature dependence such that a resistance value of an equivalent series resistance increases with a decrease in the temperature of said capacity element, and said control device includes a voltage variation estimation device to estimate voltage variation corresponding to a detection value of the temperature of said capacity element by previously setting a relationship between the voltage variation generated in said equivalent series resistance and the temperature of said capacity element and referring to said set relationship, a first setting device to set a first upper limit value based on the element withstand voltage of said switching element and a surge voltage superimposed on said input voltage when a detection value of the temperature of said switching element is not less than a predetermined threshold value, and a second setting device to set a second upper limit value by decreasing said first upper limit value by a voltage corresponding to said voltage variation estimated by said voltage variation estimation device when the detection value of the temperature of said switching element is lower than said predetermined threshold value.

8. The load drive device according to claim 5, wherein said control device further includes a target value setting device to set a target value of said output voltage based on a request output of said electric load, and a target value correcting device to correct said target value to a value of less than said upper limit value.

9. A load drive device comprising:

a DC power supply configured to allow an output voltage to be variably controlled;

a drive circuit converting a DC voltage from said DC power supply into an AC voltage by a switching operation of a switching element to drive-control an electric load;

a capacity element provided between said DC power supply and said drive circuit and smoothing the output voltage of said DC power supply for inputting to said drive circuit; and a control device controlling said DC power supply, said capacity element having a temperature dependence such that a resistance value of an equivalent series resistance increases with a decrease in temperature of said capacity element, said switching element having a temperature dependence such that an element withstand voltage decreases with a decrease in temperature of said switching element, and in response to a request from said electric load, said control device setting the output voltage of said DC voltage to a value of less than an upper limit value of an input voltage of said drive circuit set depending on the temperature of each of said capacity element and said switching element.

10. The load drive device according to claim 9, further comprising:

a first temperature sensor detecting the temperature of said capacity element; and a second temperature sensor detecting the temperature of said switching element, wherein said control device includes a voltage variation estimation device to estimate voltage variation corresponding to a detection value of the temperature of said capacity element by previously setting a relationship between the voltage variation generated in said equivalent series resistance and the temperature of said capacity element and referring to said set relationship;

a first setting device to set a first upper limit value based on the element withstand voltage of said switching element and a surge voltage superimposed on said input voltage when at least one of the detection value of the temperature of said capacity element and a detection value of the temperature of said switching element is not less than a predetermined threshold value; and a second setting device to set a second upper limit value by decreasing said first upper limit value by a voltage corresponding to said voltage variation estimated by said voltage variation estimation device when the detection value of the temperature of said capacity element and the detection value of the temperature of said switching element are lower than said predetermined threshold value.

11. The load drive device according to claim 9, wherein said control device further includes a target value setting device to set a target value of said output voltage based on a request output of said electric load, and a target value correcting device to correct said target value to a value of less than said upper limit value.

* * * * *